United States Patent
Lipan

(10) Patent No.: US 7,889,012 B2
(45) Date of Patent: Feb. 15, 2011

(54) SYSTEM AND METHOD FOR CYCLE SLIP PREVENTION IN A FREQUENCY SYNTHESIZER

(75) Inventor: Tudor Lipan, Ottawa (CA)

(73) Assignee: Hittite Microwave Corporation, Chelmsford, MA (US)

( * ) Notice: Subject to any disclaimer, the term of this patent is extended or adjusted under 35 U.S.C. 154(b) by 100 days.

(21) Appl. No.: 12/387,525

(22) Filed: May 4, 2009

(65) Prior Publication Data

US 2009/0278618 A1 Nov. 12, 2009

Related U.S. Application Data

(60) Provisional application No. 61/126,702, filed on May 6, 2008.

(51) Int. Cl.
   - H03D 13/00 (2006.01)
   - H03L 7/06 (2006.01)
   - H03L 7/085 (2006.01)

(52) U.S. Cl. .................... 331/1 A; 331/16; 331/25; 331/DIG. 2; 327/12

(58) Field of Classification Search ........... 331/1 A, 331/8, 16–18, 25, DIG. 2; 327/2, 3, 12
See application file for complete search history.

(56) References Cited

U.S. PATENT DOCUMENTS

| | | | |
|---|---|---|---|
| 4,902,920 A | 2/1990 | Wolaver | |
| 5,493,243 A | 2/1996 | Ghoshal | |
| 5,790,613 A | 8/1998 | Tateishi | |
| 6,256,362 B1 | 7/2001 | Goldman | |
| 6,265,902 B1 * | 7/2001 | Klemmer et al. | 327/2 |
| 6,441,691 B1 | 8/2002 | Jones et al. | |
| 6,556,086 B2 | 4/2003 | Keaveney et al. | |
| 6,624,705 B1 | 9/2003 | Huard et al. | |
| 6,771,096 B1 | 8/2004 | Meyers et al. | |
| 7,012,471 B2 | 3/2006 | Lyden et al. | |
| 7,317,360 B2 | 1/2008 | Keaveney | |
| 7,463,710 B2 | 12/2008 | Walsh et al. | |
| 2002/0125961 A1 | 9/2002 | Jones et al. | |

OTHER PUBLICATIONS

Written Opinion from International Searching Authority, PCT/US09/02767, dated Jun. 30, 2009, 4 pages (unnumbered).

* cited by examiner

*Primary Examiner*—David Mis
(74) *Attorney, Agent, or Firm*—Iandiorio Teska & Coleman

(57) ABSTRACT

An improved method of cycle slip prevention in a frequency synthesizer is achieved by determining phase error between a divided VCO and reference, determining whether a phase error of a full cycle slip has occurred and in which direction and altering the phase of the VCO divided signal in the amount and direction to reduce the phase error to less than one reference cycle. The result is an improved transfer function of the PFD, proportional to the phase error in the region $-2*pi$ to $2*pi$, and fixed close to maximum when the phase error exceeds the above interval. This invention is achieved with the addition of digital circuitry to monitor and control the PFD and the VCO divider, and does not require additional analog charge pump circuitry.

10 Claims, 8 Drawing Sheets

With Cycle Slip Prevention

SYSTEM AND METHOD FOR CYCLE SLIP PREVENTION IN A FREQUENCY SYNTHESIZER

RELATED APPLICATIONS

This application claims benefit of and priority to U.S. Provisional Application Ser. No. 61/126,702 filed May 6, 2008 under 35 U.S.C. §§119, 120, 363, 365, and 37 C.F.R. §1.55 and §1.78 incorporated herein by this reference.

FIELD OF THE INVENTION

This invention relates to an improved method and system for preventing cycle slip in a frequency synthesizer.

BACKGROUND OF THE INVENTION

Frequency synthesizers are used in virtually all wireless devices to create the fundamental frequency at which the wireless device operates. Wireless communications often need to change the frequency of operation. The amount of time required to change the frequency of the wireless device is normally time during which the wireless device cannot function normally, that is it cannot transmit or receive data when changing frequencies. Wireless applications are very cost sensitive, hence a method to achieve fast switching of frequencies is very important. Reliability of wireless devices is also very important, and analog methods tend to be larger, cost more and are often less reliable than their digital counterparts. Most modern integrated frequency synthesizers use a device known as a phase frequency detector (PFD) which measures the difference in phase and frequency between the reference (REF) and the voltage controlled oscillator (VCO). The classic PFD suffers from a problem known as cycle slipping which results in longer times to change frequency. The REF and VCO inputs are acted upon by the PFD which creates output UP and DOWN switching signals which in turn drive current onto a loop filter that controls the voltage controlled oscillator. When the REF and VCO signals are in phase, both up and down pulses are short and equal. When the synthesizer changes frequency, initially the VCO signal frequency is no longer equal to the REF signal frequency. If the VCO frequency is slightly different than the REF, then the phase error will build up and the up/down pulses will have different durations, proportional with the phase error. As the error increases, the charge pump will be ON longer, thus the charge pumped into the loop filter will increase proportionally. However, when the phase error exceeds 360 degrees, it wraps back to zero and the overall result is that the charge pump is turned ON for very short periods of time, thus the correction charge pushed into the loop filter drops back toward zero, despite the fact that significant errors exist in frequency. This causes the VCO divided signal to slip a cycle relative to the REF, and the rate of tuning of the VCO in the direction of the desired new frequency will decrease or possibly even reverse temporarily. The net result is that the time for the VCO to change from the start frequency to the final frequency increases, and the overall time to lock to the new frequency also increases. One approach detects that a cycle slip is about to occur and turns on an extra charge pump current cell. This outputs a constant current to the loop filter, or removes a constant current from the loop filter (depending on whether the VCO tuning voltage needs to increase or decrease to acquire the new frequency). The effect is that the linear range of the PFD is increased. Stability is maintained because the current is constant and is not a pulsed current. If the phase error increases again to a point where another cycle slip is likely, it turns on another charge pump cell. This continues until it detects that the VCO frequency has gone past the desired frequency. It then begins to turn off the extra charge pump cells one by one until they have all been turned off and the frequency is settled. A drawback of this approach is that it requires extra analog circuitry which adds cost, complexity, and parasitic capacitance to the pump, thus limiting its upper frequency of operation. In most applications, it is enough to eliminate cycle slips altogether, giving much faster lock times. Other approaches apply similar techniques which may be quite complex. Some require more complex and sensitive timing of the VCO, others a complex mix of muxes and counters.

SUMMARY OF THE INVENTION

It is therefore an object of this invention to provide an improved system and method for cycle slip prevention in a frequency synthesizer.

It is a further object of this invention to provide such an improved system and method for cycle slip prevention that requires no additional analog circuitry.

It is a further object of this invention to provide such an improved system and method for cycle slip prevention that can be implemented in digital circuitry.

It is a further object of this invention to provide such an improved system and method for cycle slip prevention that achieves significant reduction in frequency acquisition time without extra large and costly analog hardware.

It is a further object of this invention to provide such an improved system and method for cycle slip prevention in which the added digital circuitry is minimal in area and cost.

The invention results from the realization that cycle slip in a frequency synthesizer can be prevented by determining phase error between the divided VCO and the reference and whether a cycle slip is about to occur and in what direction, then modifying the phase of the divided VCO in the amount and direction to reduce the phase error to less than one cycle; the phase shift can be effected by temporarily modifying the VCO divisor. The net effect is to hold the charge pump at or near its maximum gain in the desired polarity.

The subject invention, however, in other embodiments, need not achieve all these objectives and the claims hereof should not be limited to structures or methods capable of achieving these objectives.

This invention features a frequency synthesizer system with cycle slip prevention including a voltage controlled oscillator (VCO), a VCO divider, and a VCO divider control for defining a predetermined divisor for the VCO divider. A phase frequency detector (PFD) is responsive to a reference and the VCO divider output for determining any phase error between the reference and VCO divider output, whether a phase error of a full cycle slip has occurred and the direction of the cycle slip. A state machine is responsive to the direction of the cycle slip to reset the phase frequency detector and drive the VCO divider control to modify the predetermined divisor to alter the phase of the divided signal at the phase detector in the direction to reduce the phase error to less than one reference cycle.

In preferred embodiments the phase frequency detector may include a saturation circuit for indicating when a cycle slip has occurred and its direction. The phase frequency detector may include a reset saturation resolver circuit for identifying a cycle slip saturation which occurs during a reset period. The phase frequency detector may include a main reference flip flop for setting in response to a reference pulse, a main VCO flip flop for setting in response to a VCO pulse, and a reset circuit for resetting the main flip flops. The saturation circuit may include a saturation reference flip flop for setting in response to a second reference pulse occurring while the main reference flip flop is set to provide an up saturation signal identifying an up cycle slip and a saturation VCO flip flop for setting in response to a second VCO pulse occurring while the main VCO flip flop is set to provide a down saturation signal indicating a down cycle slip. The reset saturation resolver circuit may include a reference saturation OR gate having one input from the set output of the main reference flip flop and a second inverted input from the reset circuit for setting the saturation reference flip flop when the second reference pulse occurs during the reset; and a VCO saturation OR gate having one input from the set output of the main VCO flip flop and a second inverted input from the reset circuit for setting the VCO saturation flip flop when a the second VCO pulse occurs during the reset.

The invention also features an improved method of cycle slip prevention in a frequency synthesizer including determining phase error between a divided VCO and reference, determining whether a phase error of a full cycle slip has occurred and in which direction and altering the VCO divided phase in the amount and direction to reduce the phase error to less than one reference cycle to hold the charge pump at, or close to maximum gain, until the VCO is near lock and the phase error stays lower than 2*PI.

In preferred embodiments the phase may be altered by shifting the phase of the divided VCO by modifying the VCO divisor.

This invention also features an improved method of cycle slip prevention including determining the phase error between a divided VCO and a reference, driving an active loop filter to provide an output proportional in magnitude to the phase error in the range +/−2*PI and holding the divided VCO phase error near, but less than absolute (2*PI), such that the output of the control signal stays at, or near maximum, in the correct polarity, while the VCO is out of lock, and only reducing the correction signal when the VCO is near lock and the divided phase error is less than absolute (2*PI).

In a preferred embodiment the active loop filter may include a charge pump.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
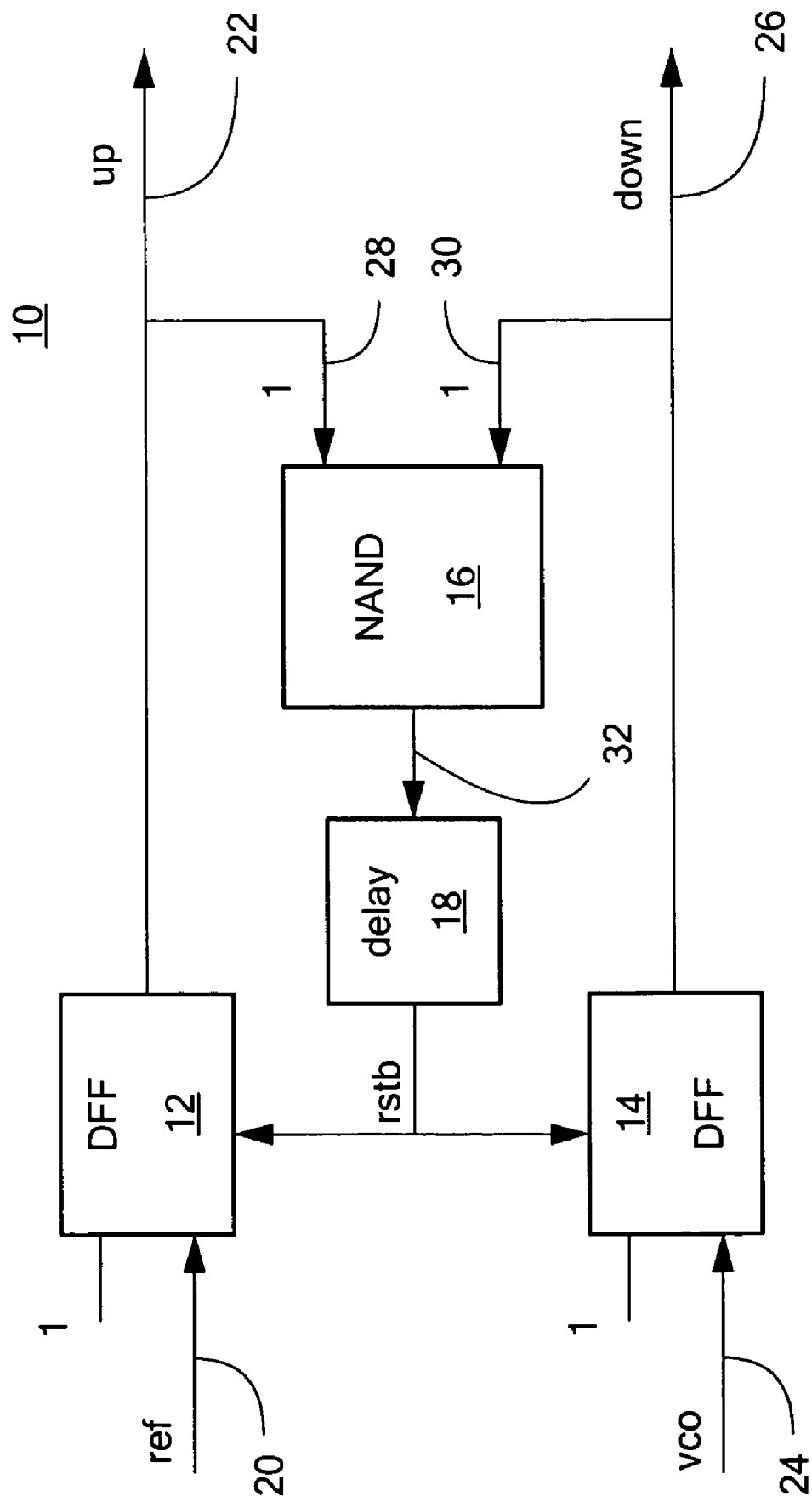
FIG. 1 is a schematic block diagram of a prior art phase frequency detector (PFD) used in a conventional frequency synthesizer.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a prior art phase frequency detector (PFD) 10 including a pair of flip flops, main reference flip flop 12 and main VCO flip flop 14, along with NAND gate 16 and delay circuit 18. In normal operation a reference signal appears on line 20 at main reference flip flop 12 and sets it to provide the up signal on output 22. The VCO signal appears on line 24 and this in turn sets main VCO flip flop 14 which in turn provides the down signal on output 26. When the reference input and VCO input occur in phase so to do the up and down signals on outputs 22 and 26, so that the charge pumps in the loop filter are equally effected. When they are out of phase, for example, when VCO signal on input 24 lags reference signal on input 20, then the up signal on output 22 will start earlier and therefore be longer than the later appearing down signal on output 26. This provides a greater charge through the charge pump in the loop filter and drives the VCO signal 24 a little bit faster to once again catch up to the reference signal 20. Upon the appearance of both the up and down signal there is a logic one at each input 28 and 30 of NAND gate 16 which provides a logic zero at its output 32 that, through delay 18, resets main flip flops 12 and 14. One problem with this prior art phase frequency detector is that if the phase difference or phase error between the reference signal and VCO divided signal on inputs 20 and 24 becomes greater than a full cycle, the phase frequency detector 10 remains ignorant of this and a so called cycle slip will occur. For example, if the phase error is under 360° the system works as designed. But if the phase error is over 360°, for example 365° the system sees only a 5° error, and responds to only a 5° error remaining ignorant of the fact that an additional 360° full cycle slip has occurred. Stated in another way the output current of the PFD-CP is proportional to the input phase difference, larger phase error leads to large output current to correct the VCO. However when the phase error exceeds 360 deg the output current drops to zero and it is proportional to phase error modulo 2*PI.

Figure 2A:
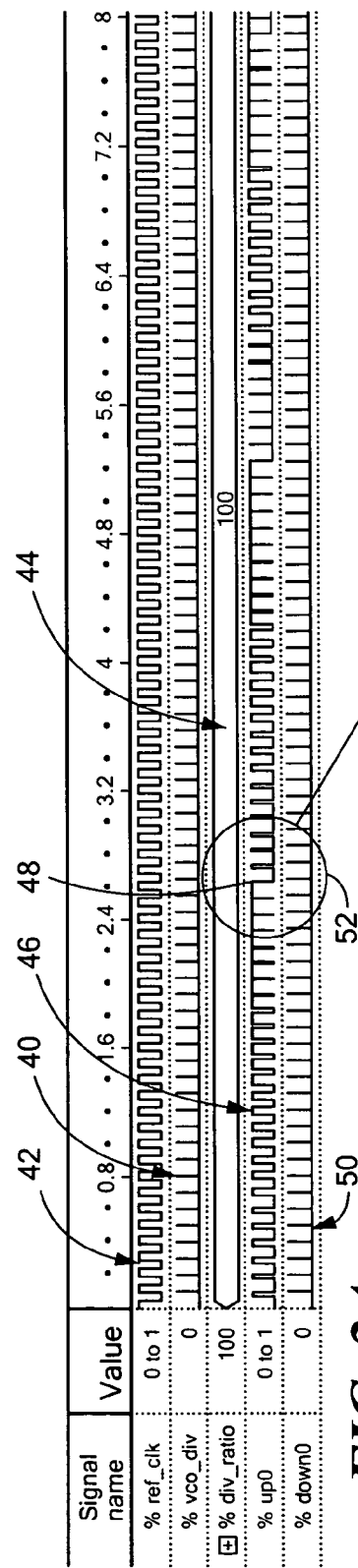
FIG. 2A shows certain waveforms occurring in the PFD of FIG. 1 illustrating cycle slip.
Figure 2B:
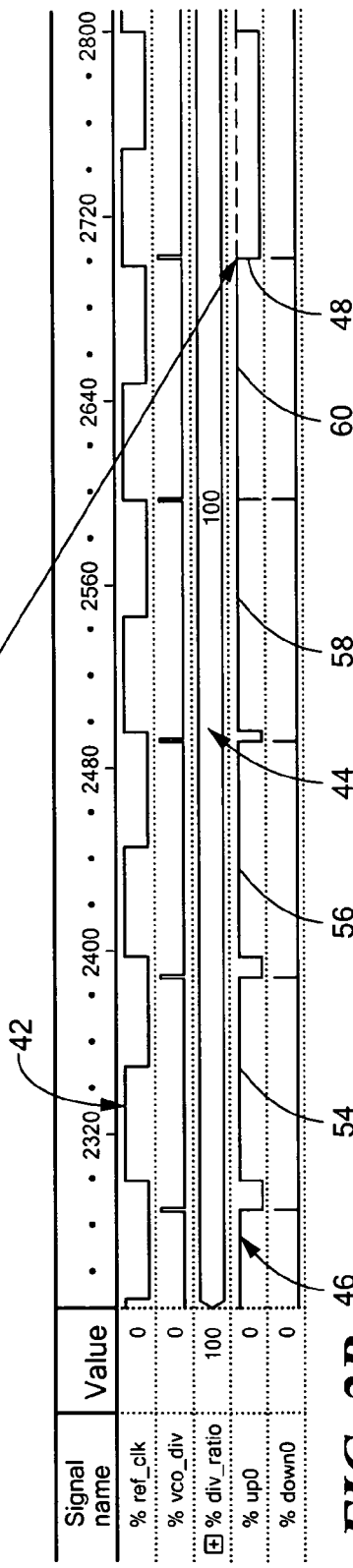
FIG. 2B is an enlarged view of a portion of the waveforms of FIG. 2A.
Figure 2C:
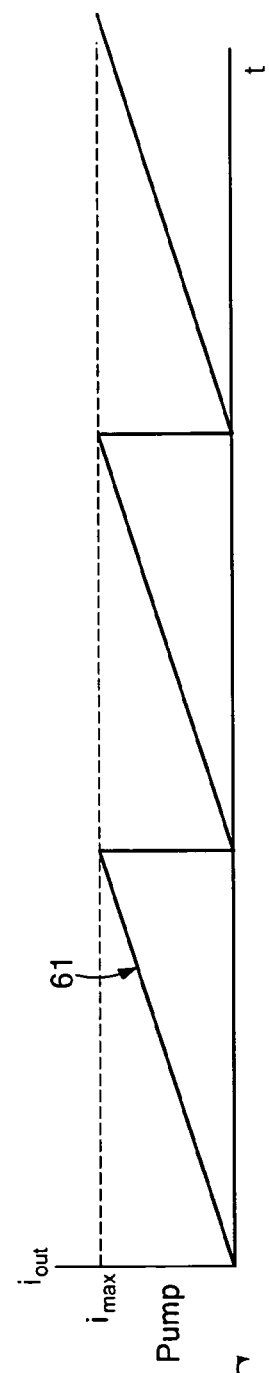
FIG. 2C shows a greatly enlarged view of the resulting output current from the charge pump, which increases to Imax, then drops back to zero when cycle slip occurs.

This can been seen with reference to FIGS. 2A and 2B wherein the VCO divided signal 40 is shown as lagging more and more the reference signal 42. The divider ratio for the frequency synthesizer 44 is set at some value, for example, 100, as shown in FIG. 2A. As the VCO divided signal 40 lags more and more the reference signal 42 the up signal 46 becomes larger and larger until at last, at a full cycle slip as at 48, the system reverts to compensating only for the difference between the full cycle and the remaining error and is oblivious to the fact that a full cycle has been slipped. The down signal 50 has continued as usual responding to the VCO divider signal 40. The area of FIG. 2A in loop 52 is shown enlarged in FIG. 2B. There it can be seen that as the up signal 46 grows larger with each increasing pulse 54, 56, 58, 60 it eventually exceeds a full cycle as at 48 where 58 and 60 merge and the system again reacts oblivious to the full cycle slip. This cycle slip problem occurs when ever two reference clocks are received during the same VCO divided cycle or two VCO clocks from the VCO divider are received during the same reference cycle. The resulting output current 61, FIG. 2C, from the charge pump increases to $I_{max}$ then drops back to zero when cycle slip occurs.

Figure 3:
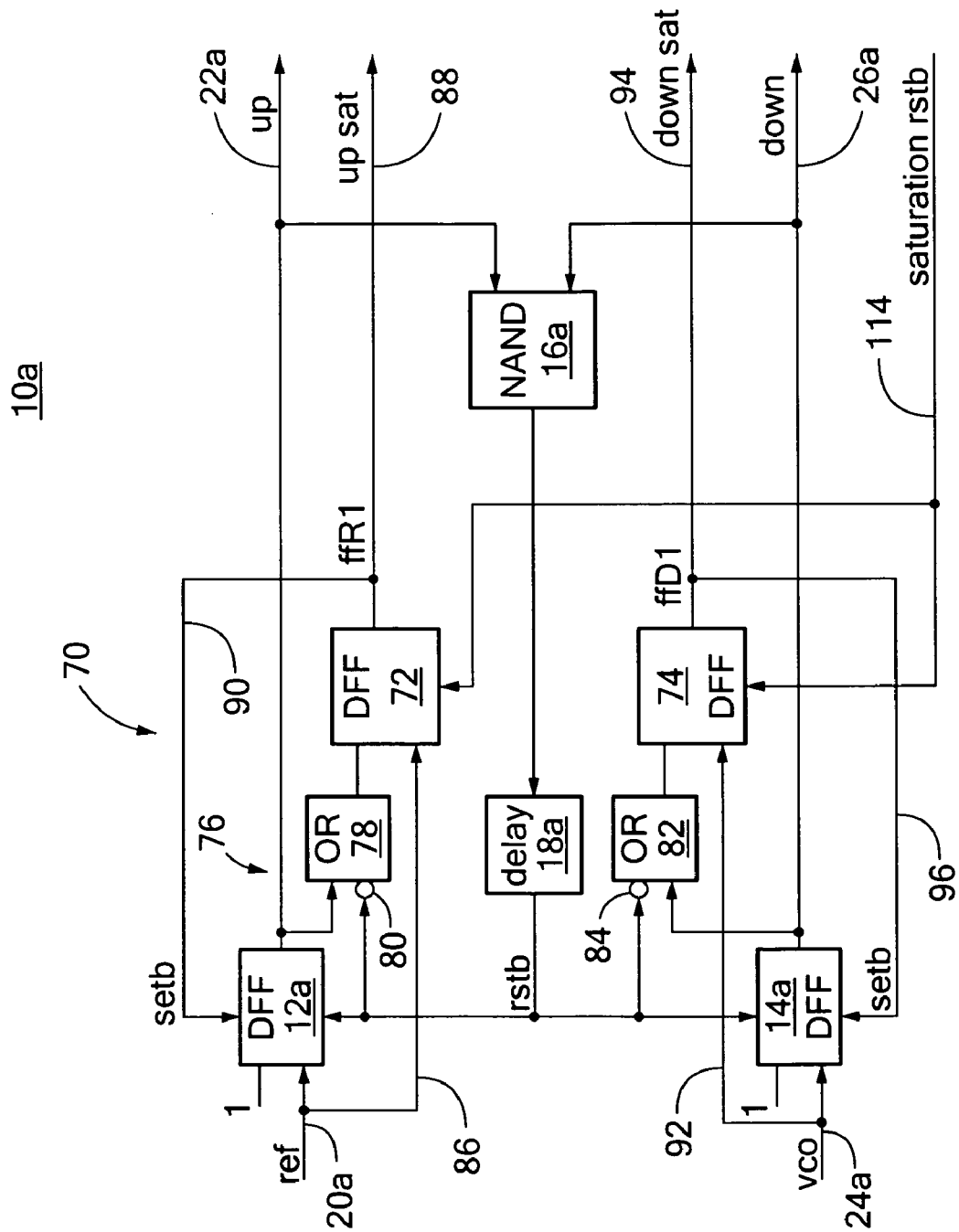
FIG. 3 is a schematic block diagram of an improved PFD according to this invention for overcoming cycle slip.

With a phase frequency detector 10a, FIG. 3, according to this invention the conventional phase frequency detector components of main flip flops 12a, 14a, NAND gate 16a, and delay 18a are supplemented with saturation circuit 70 including saturation reference flip flop 72 and saturation VCO flip flop 74. There may also be a reset saturation resolver circuit 76 which includes reference OR gate 78 and inverter 80 and VCO OR gate 82 with inverter 84. With this circuit when either of the two conditions, that is, two reference clocks received during the same VCO cycle or two VCO clocks being received during the same reference cycle the appropriate supplemental saturation flip flop 72, 74 is set and holds the appropriate up and down pulse at outputs 22a and 26a high. It also provides the up sat and down sat flags which are exported to a small state machine, as will be explained with respect to FIG. 4, informing the state machine in which direction the phase frequency detector was saturated.

In operation a first reference pulse on input 20a sets main reference flip flop 12a which then provides the usual up signal on output 22a and also provides one signal through OR gate 78 to saturation reference flip flop 72. If a second reference pulse occurs before the system is reset by the appearance of a VCO pulse to enable NAND gate 16a and through delay 18a to provide the reset to main reference flip flop 12a as well as main VCO flip flop 14a, that second reference pulse will provide the second input on line 86 to saturation reference flip flop 72. This then provides the up sat signal on line 88 and provides a set signal on line 90 which is fed back to main reference flip flop 12a to keep it in the on position. This appearance of the second reference pulse indicates that the VCO signal is lagging the reference signal.

In contrast, if two VCO pulses on line 24a occur while there is only one reference pulse on line 20a, indicating that the VCO signal is leading the reference signal, then it is the saturation VCO flip flop 74 which is set through OR gate 82 upon the occurrence of the second VCO signal on line 92. Thus, saturation VCO flip flop 74 provides the down saturation signal on line 94 and also provides the set signal on line 96 to hold main VCO flip flop 14a in the set condition. As before the up and down signals on outputs 22a and 26a go to charge pumps in the loop filter. The up sat and down sat signals on lines 88 and 94, however, go to the state machine. Thus, phase frequency detector 10a according to this invention can identify when a cycle slip has occurred and in what direction and inform the state machine which then will compensate by controlling the VCO divider, as explained with respect to FIG. 4. A further improvement results from the implementation of reset saturation resolver circuit 70 including OR gates 78 and 82 along with their inverters 80 and 84. Reset saturation resolver circuit 70 insures that a second reference pulse occurring on line 86 or a second VCO pulse occurring on line 92 can truly set the associated saturation flip flop 72, 74 even though a reset signal may have been applied by delay 18a to reset main flip flops 12a and 14a. The problem arises because it is possible that during this reset of main flip flops 12a, 14a which occupies a finite period of time, the second pulse, be it reference or VCO, could occur and the system could be blinded to it. To prevent this, the zero logic reset signal is presented to inverters 80 and 84 which then present a logical one to OR gates 78 and 82. Thus if the second pulse occurs either on line 86 or 92, as the case may be, during a reset, the reset itself through inverter 80 or 84 and the associated OR gate 78 and 82, respectively, will provide the other input to the associated saturation flip flop 72, 74 so that the second pulse is not overlooked and the full cycle slip missed. To effect this main flip flops 12a, 14a must be settable and setb on lines 90, 96 must have higher priority than rstb from delay 18a.

Figure 4:
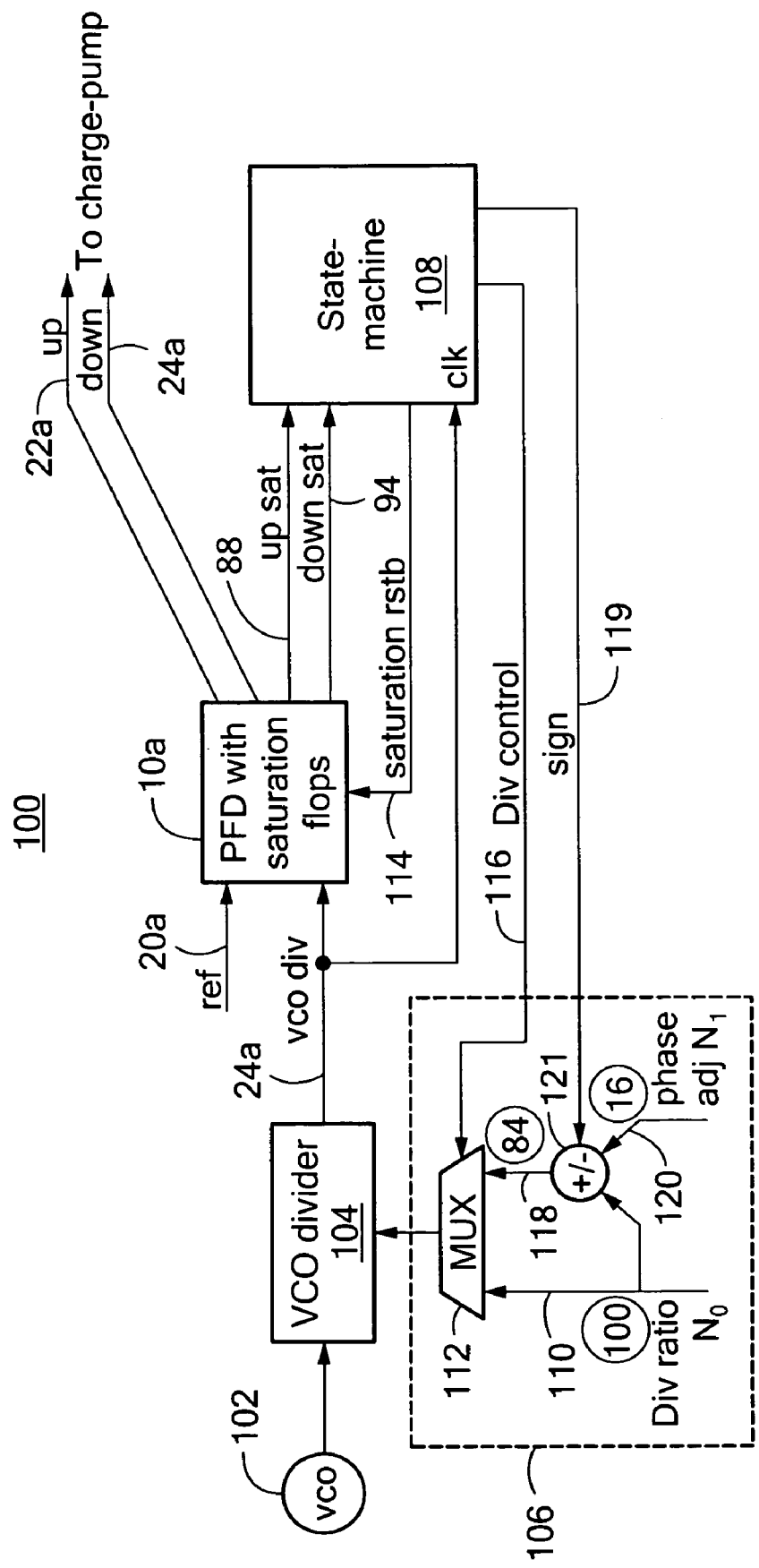
FIG. 4 is a schematic block diagram of an improved frequency synthesizer using the improved PFD of FIG. 3 according to this invention.
Figure 5:
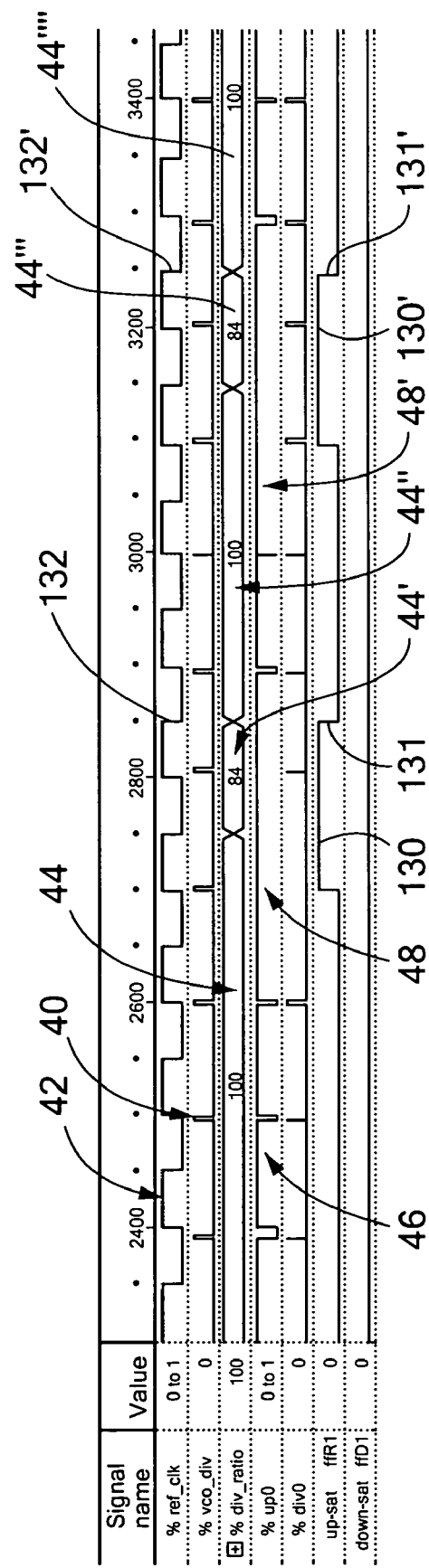
FIG. 5 shows certain waveforms occurring in the PFD of FIG. 3.

A frequency synthesizer 100 with phase frequency detector 10a according to this invention is shown in FIG. 4, along with a voltage controlled oscillator VCO 102 and VCO divider 104. Also shown in FIG. 4, are VCO divider controller 106 and state machine 108. In normal operation VCO 102 provides the signal to VCO divider 104, where it is divided by divisor $N_0$: in this explanation $N_0$ equals 100. This normally appears on line 110 and is the default output of mux 112 to VCO divider 104. However, as up signal 46 pulses, FIG. 5, become longer and longer, eventually as at 48, the full cycle is exceeded. At this point, since the VCO signal is lagging the reference signal the up sat signal is provided by the operation of saturation reference flip flop 72, FIG. 3, which has recognized a full cycle slip. This immediately provides the signal ffR1 130, FIG. 5, from saturation reference flip flop 72, FIG. 3, which is the up sat signal. Following receipt of this signal state machine 108, FIG. 4, switches the divisor from 100, FIG. 5, shown at 44, to 84, shown at 44'. Upon the next negative going portion of reference signal 42 at 132 state machine 108, FIG. 4, changes the divisor from 84, 44' back to 100 at 44", FIG. 5, ffR1 returns to zero at 131 and the system begins again to operate in a normal fashion. When the problem occurs again, such as at 48' the up sat (FFR1) signal 130' is produced again, state machine 108, FIG. 4, switches from 100, 44" to 84 at 44''', FIG. 5, and once again on the negative going slope 132' of reference clock 42, 84 at 44''' is switched by state machine 108, FIG. 4, back to 100 at 44'''', FIG. 5. At this time state machine 108, FIG. 4, again sends out the saturation reset signal on line 114 which also resets saturation reference flip flop 72 at 131'. When state machine 108 is informed of the saturation and its direction by an up sat/down sat signal on lines 88, 94, it sends a control signal on line 116 to mux 112 to shift from the normal input on line 110 to the input on line 118. It also sends the sign signal on line 119 to set the proper sign in summer 121 to add or subtract the $N_1$ input on line 120. For example, if the VCO signal lags the reference signal a minus sign is commanded of summer 121 and the normal divisor ratio $N_0$ e.g. 100 has subtracted from it $N_1$ e.g. 16 to provide a divisor of 84 through mux 112 to VCO divider 104.

Figure 6:
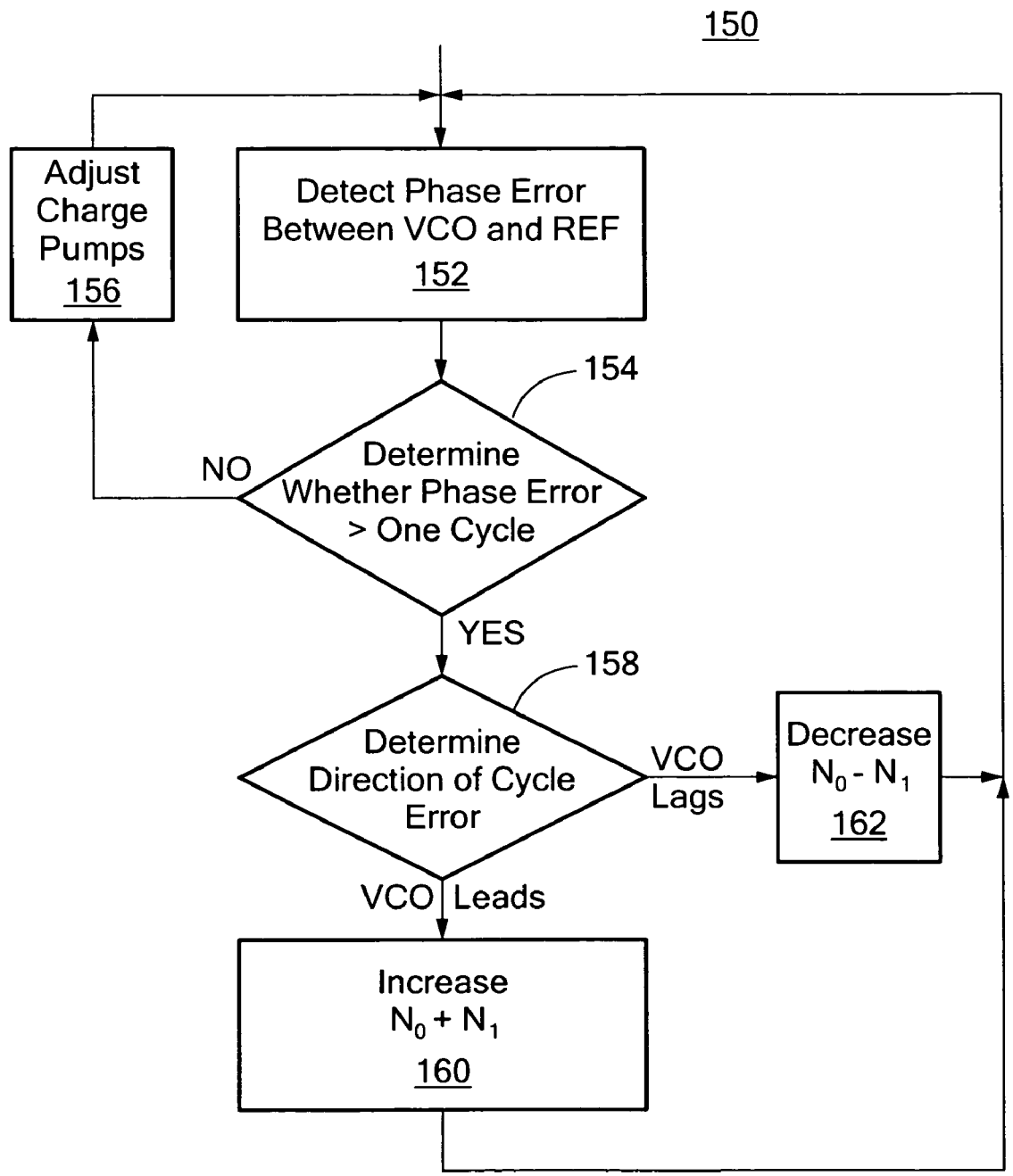
FIG. 6 is a flow chart showing the improved method of cycle slip prevention according to this invention.

This invention also involves a method of cycle slip prevention in a frequency synthesizer by determining the phase error between a divided VCO and reference signal, determining whether a phase error of a full cycle has occurred and which direction and then altering the phase of the VCO divided signal in the amount and direction to reduce the phase error to less than one reference cycle so as to hold the charge pump at or close to maximum gain, until the VCO is near lock and the phase error stays lower than 2*PI. This is shown in FIG. 6 where method 150 begins with detecting the phase error between the divided VCO and reference signals 152. A determination is made 154 as to whether the phase error is greater than one cycle. If it is not then an adjustment is made to the charge pumps in the normal way 156 and the system returns to step 152. If it is greater than one cycle, i.e. the PFD slipped a cycle, then the direction of the cycle slip is determined 158. If the VCO leads the reference signal then the divisor is increased, that is, $N_1$ is added $N_0$ in step 160. If VCO lags the reference signal then the divisor is decreased and the phase adjustment $N_1$ is subtracted from $N_0$, 162. In a typical embodiment, then, the phase error between a divided VCO and a reference is determined. An output control signal drives a charge pump or other type of active loop filter so that the output is proportional in magnitude to the phase error in the range +/−2*PI. The phase error at the PFD is then controlled by modifying the VCO divider and holding the divided VCO phase error near, but less than absolute (2*PI), so that the output of the control signal stops at, or near maximum, in the correct polarity, while the VCO is out of lock, and only reduces the correction signal when the VCO is near lock and the divided phase error is less than absolute (2*PI).

Figure 7:
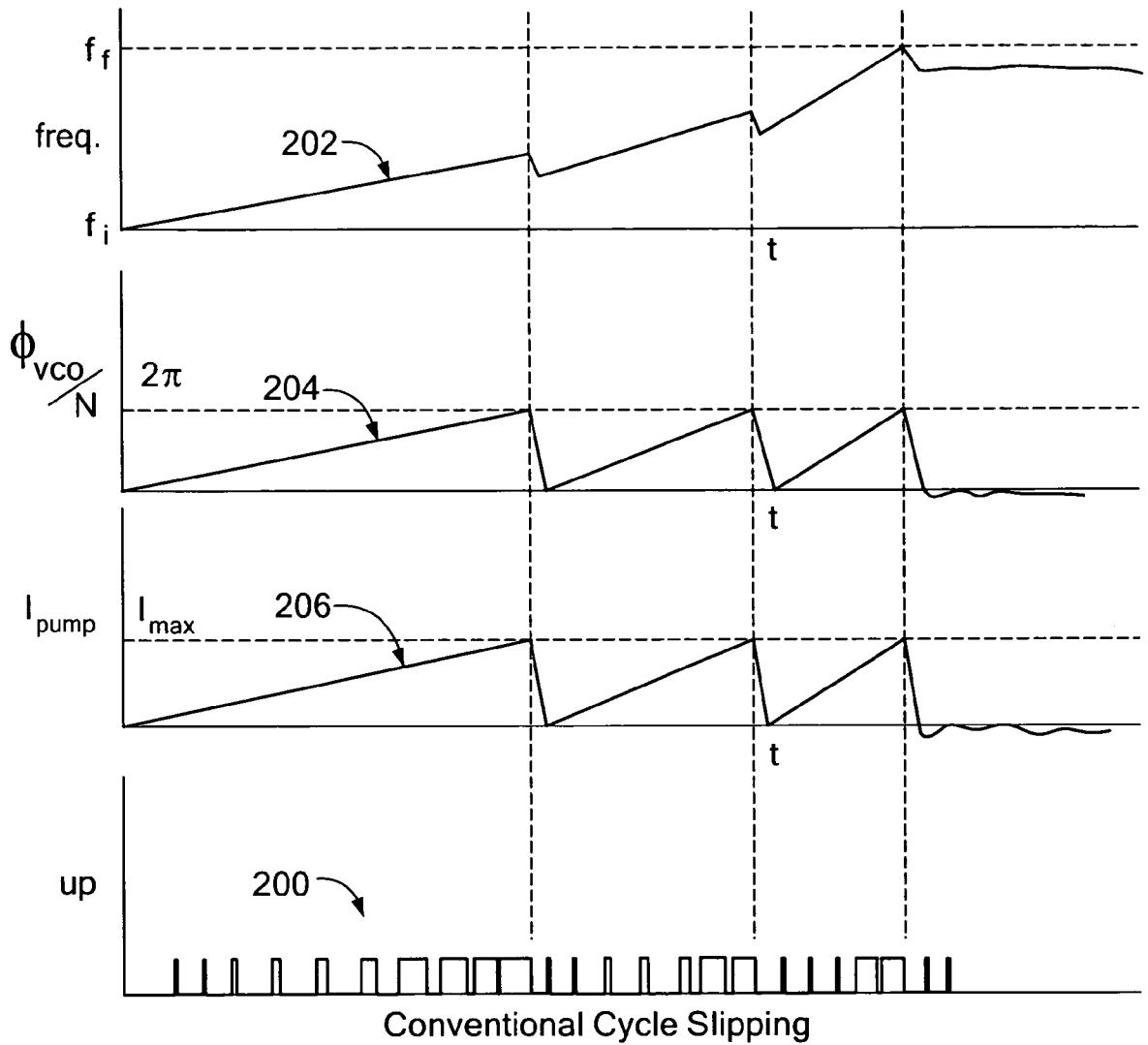
FIG. 7 shows PFD, charge pump, phase of divided VCO and frequency of VCO with conventional PFD.
Figure 7A:
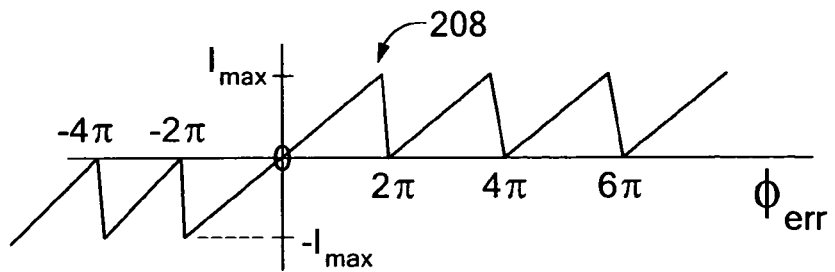
FIG. 7A shows a transfer function for a conventional PFD.
Figure 8:
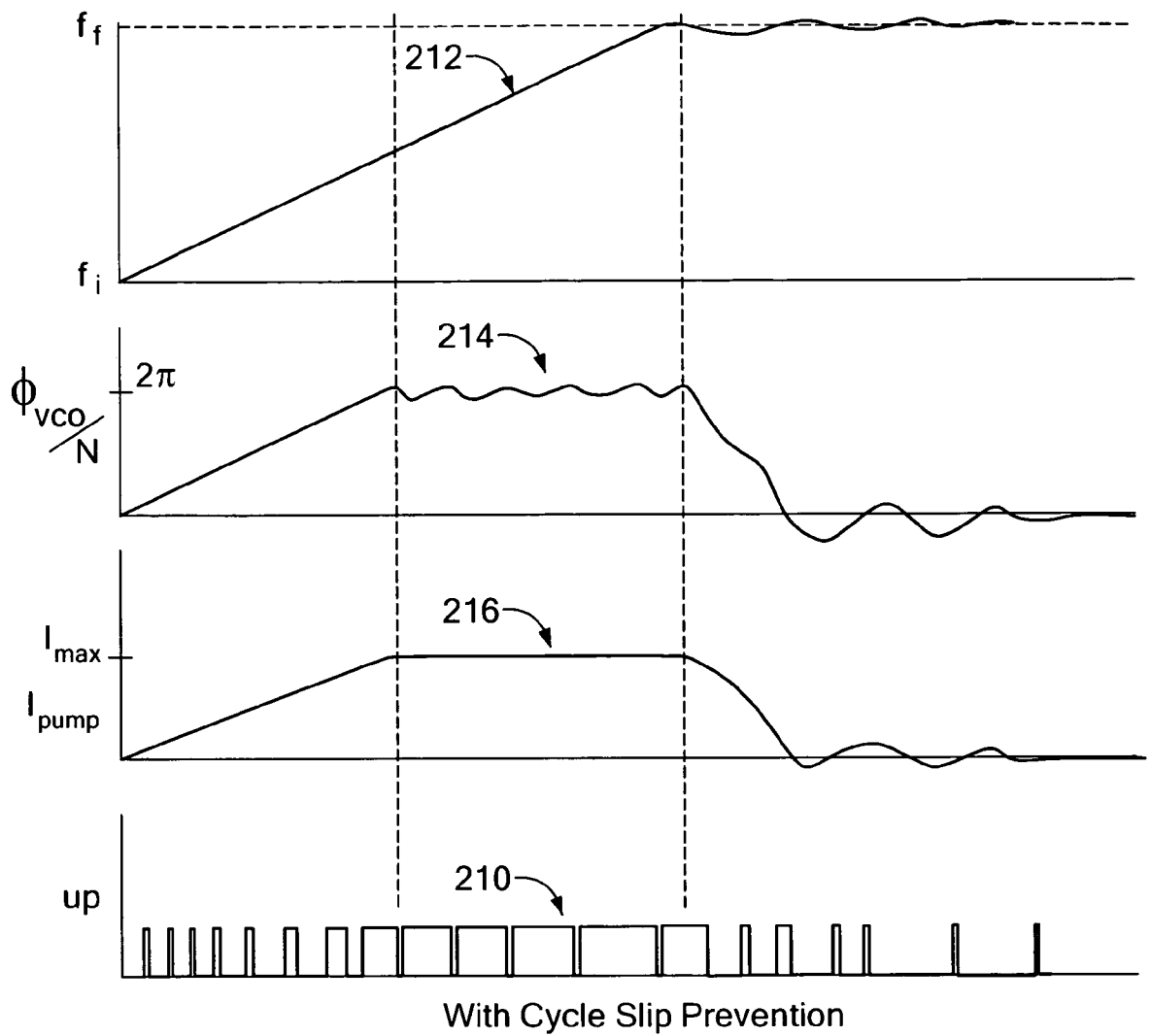
FIG. 8 shows PFD, CP, phase of the divided VCO and frequency of the VCO with the present cycle slip prevention invention.
Figure 8A:
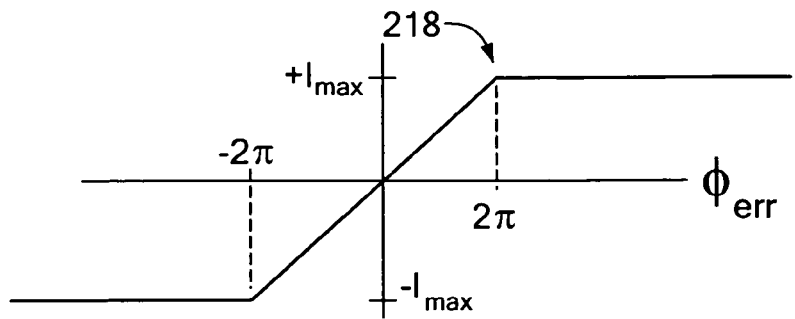
FIG. 8A shows a transfer function for the improved system of this invention.

The conventional cycle slipping is illustrated at 200, FIG. 7, along with the attendant VCO frequency 202, phase divided VCO 204, and charge pump current 206. The resulting transfer function 208 is shown in FIG. 7A. In contrast, the illustration with cycle slip prevention according to this invention is shown at 210, FIG. 8, along with the attendant VCO frequency 212, phase divided VCO 214 and charge pump current 216. The resulting improved transfer function 218 appears in FIG. 8A.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A frequency synthesizer system with cycle slip prevention comprising:
    a voltage controlled oscillator (VCO);
    a VCO divider;
    a VCO divider control for defining a predetermined divisor for said VCO divider;
    a phase frequency detector (PFD) responsive to a reference and said VCO divider output for determining any phase error between said reference and VCO divider output, whether a phase error of a full cycle slip has occurred and the direction of the cycle slip; and
    a state machine, responsive to the direction of the cycle slip to reset said phase frequency detector and drive said VCO divider control to modify said predetermined divisor to alter the phase of the divided signal at said phase detector in the direction to reduce the phase error to less than one reference cycle.

2. The frequency synthesizer system of claim 1 in which said phase frequency detector includes a saturation circuit for indicating when a cycle slip has occurred and its direction.

3. The frequency synthesizer system of claim 2 in which said phase frequency detector includes a reset saturation resolver circuit for identifying a cycle slip saturation which occurs during a reset period.

4. The frequency synthesizer system of claim 3 in which said phase frequency detector includes a main reference flip flop for setting in response to a reference pulse, a main VCO flip flop for setting in response to a VCO pulse, and a reset circuit for resetting said main flip flops.

5. The frequency synthesizer system of claim 4 in which said saturation circuit includes a saturation reference flip flop for setting in response to a second reference pulse occurring while said main reference flip flop is set to provide an up saturation signal identifying an up cycle slip and a saturation VCO flip flop for setting in response to a second VCO pulse occurring while said main VCO flip flop is set to provide a down saturation signal indicating a down cycle slip.

6. The frequency synthesizer system of claim 5 in which said reset saturation resolver circuit includes a reference saturation OR gate having one input from the set output of said main reference flip flop and a second inverted input from said reset circuit for setting said saturation reference flip flop when a said second reference pulse occurs during the reset; and a VCO saturation OR gate having one input from the set output of said main VCO flip flop and a second inverted input from said reset circuit for setting said VCO saturation flip flop when a said second VCO pulse occurs during the reset.

7. An improved method of cycle slip prevention in a frequency synthesizer comprising:
    determining phase error between a divided VCO and reference;
    determining whether a phase error of a full cycle slip has occurred and in which direction; and
    altering the VCO divided phase in the amount and direction to reduce the phase error to less than one reference cycle, to hold the charge pump at, or close to maximum gain, until the VCO is near lock and the phase error stays lower than 2*PI.

8. The improved method of cycle slip prevention in a frequency synthesizer of claim 7 in which the phase is altered by shifting the phase of the divided VCO by modifying the VCO divisor.

9. An improved method of cycle slip prevention comprising:
    determining the phase error between a divided VCO and a reference;
    driving an active loop filter to provide an output proportional in magnitude to the phase error in the range +/−2*PI; and
    holding the divided VCO phase error near, but less than absolute (2*PI), such that the output of the control signal stays at, or near maximum, in the correct polarity, while the VCO is out of lock, and only reducing the correction signal when the VCO is near lock and the divided phase error is less than absolute (2*PI).

10. The improved method of cycle slip prevention of claim 9 in which the active loop filter includes a charge pump.

* * * * *